United States Patent [19]

Shibasaki et al.

[11] Patent Number: 4,967,387
[45] Date of Patent: Oct. 30, 1990

[54] SEMICONDUCTOR INTEGRATED CIRCUIT DEVICE

[75] Inventors: Nobuo Shibasaki, Tokyo; Toshio Tanaka, Kanagawa; Yoshiharu Nagayama, Tokyo; Kenjiro Yasunari, Tokyo, all of Japan

[73] Assignee: Hitachi, Ltd., Tokyo, Japan

[21] Appl. No.: 199,605

[22] Filed: May 27, 1988

[30] Foreign Application Priority Data

May 27, 1987 [JP] Japan ................. 62-128240
Sep. 5, 1987 [JP] Japan ................. 62-222843

[51] Int. Cl.$^5$ .................. G01R 15/12; G06F 11/32
[52] U.S. Cl. .................. 364/580; 371/16.1; 371/22.6
[58] Field of Search ........ 364/579, 580; 324/73 R, 324/73 AT; 371/16.1, 21.1–22.6

[56] References Cited

U.S. PATENT DOCUMENTS

| | | | |
|---|---|---|---|
| 3,961,251 | 6/1976 | Hurley et al. | 371/21.1 |
| 3,961,254 | 6/1976 | Cavaliere et al. | 371/27.3 |
| 4,339,819 | 7/1982 | Jacobson | 371/22.6 |
| 4,706,186 | 11/1987 | Mogi et al. | 364/579 |
| 4,799,004 | 1/1989 | Mori | 324/73 R |

OTHER PUBLICATIONS

"LSI Handbook", Issued on Nov. 30, 1988, by OHM CO., Ltd., p. 478. (Document Provided in Japanese with an English Translation Attached.).

Primary Examiner—Felix D. Gruber
Attorney, Agent, or Firm—Fay, Sharpe, Beall, Fagan, Minnich & McKee

[57] ABSTRACT

A microprocessor having a plurality of memories comprises an address selection means which supplies selectively, to the memories, the address signal generated by the address generation means provided in the microprocessor and the test address signal supplied from the external circuit. Thereby, the address of memories can be accessed directly from the external circuit for the test of memories. Moreover, the microprocessor is provided with the test bus through which the signal transmitted between the function blocks in the microprocessor is input or output from or to the external circuit. Accordingly, the function block can be tested easily.

5 Claims, 6 Drawing Sheets

SEMICONDUCTOR INTEGRATED CIRCUIT DEVICE

BACKGROUND OF THE INVENTION

The present application relates to a semiconductor integrated circuit device which is effective for use in a microprocessor comprising a plurality of memories. Moreover, the present invention relates to a semiconductor integrated circuit device forming a plurality of function cells, each of having a unit function module, on a semiconductor substrate and a testing configuration which is capable of testing each function cell in a microcomputer system.

A semiconductor integrated circuit device of the function cell system (hereinafter referred to as LSI) forming a microcomputer system, which usually mounts a processor and a variety of peripheral circuits on a printed circuit board on one semiconductor substrate, is described in the "LSI Handbook", p. 478, issued on Nov. 30, 1984 by OHM Co., Ltd. In such LSI, unit function blocks such as processors, memories, input/output port and peripheral controllers (CRT controller, communication INTERFACE controller, etc.) are considered standard function cell. These blocks are integrated on one semiconductor substrate to form an LSI as a system.

In such LSI of the function cell system, various function cells are coupled as specified through the wiring regions in accordance with the functions required by the LSI in question.

In the LSI of function cell system explained above, all signal input/output functions of the function cells comprised therein are not required to be used by the external circuits. For instance, it is usually unnecessary to provide, for the external circuit, the control signal which is used only for control of internal circuits of the LSI.

Therefore, in the case of testing an LSI formed by the function cell system, it is possible that the AC parameter test or function test of each function cell comprised therein cannot be conducted individually or easily from the external circuit. In this case, an individual test program for each function cell cannot be used. A composite test, such as an indirect function cell test, must be conducted through mutual operations of function cells. Consequently, problems such as lowering of test efficiency and reliability are generated.

A one chip microprocessor is also proposed. In this case, a microprogram system forming a processor and a peripheral circuit on one semiconductor substrate is employed. A microprocessor of this type provides a plurality of memories such as an instruction ROM (Read Only Memory), which stores microinstructions or instructions, and a data buffer RAM (Random Access Memory), which temporarily stores calculation data, etc.

SUMMARY OF THE INVENTION

FIG. 4 is a block diagram of one chip type microprocessor explained above. In FIG. 4, a microprocessor, MPU, comprises a control memory, CS, (instruction ROM) formed by ROM, a memory for register, REG, formed by a static RAM and a data buffer memory, DBM. An address input terminal, data input/output terminal and start control signal input terminal, etc. of each memory are respectively connected to the corresponding internal buses ca, BA, BB, BC, depending on the functions of the memories. A plurality of memories comprised in the microprocessor, MPU, are connected, as explained above, to individual internal buses, ca, BA, BB, BC. Direct access to such memories through the external terminals is impossible and it is difficult to individually test and measure the functions and characteristics of each memory. Therefore, the testing cost of the microprocessor increases and it becomes impossible to accurately evaluate the functions and performance of the microprocessor.

It is therefore an object of the present invention to provide a semiconductor integrated circuit device which easily realizes testing thereof.

It is another object of the present invention to provide an effective test method for memories comprised within a microprocessor.

It is another object of the present invention to reduce the testing cost of a microprocessor comprising a plurality of memories.

It is a further object of the present invention to provide a semiconductor integrated circuit device which is capable of individually testing the function cells from the external circuits even if some signal input/output functions of function cells comprised in the LSI of function cell system are not provided for the external circuits.

Aforementioned and other objects and novel characteristics of the present invention will become apparent from the description of the specification and the accompanying drawings thereof.

A typical invention disclosed in this specification can be briefly summarized as explained hereunder.

First, a selection circuit selectively transmits an address signal, data and start control signal in accordance with the specified test control signal, to the input/output ports of a plurality of memories comprised in the microprocessor. The memories are connected to the common bus in the specified test mode. Therefore, since the functions and characteristics of the plurality of memories comprised in the microprocessor can be tested individually by making direct access to them through the test bus, the testing cost of a microprocessor comprising a plurality of memories can be reduced. Further, the function and performance thereof can be evaluated more accurately.

Second, the LSI of the function cell system integrating a plurality of function cells on a semiconductor substrate, a test bus, which allows input or output of signals not provided for external circuit under the ordinary operation, is provided and thereby the specified function cells selected through the test control means can be tested from the external circuit.

Thereby, an individual test of the function cell in question from the external circuit can be realized by setting the test mode. In the test mode, input/output signals of the function cells of the LSI can be accessed, even if the signals are not normally provided to the external circuit.

DESCRIPTION OF THE PREFERRED EMBODIMENT

Figure 1:
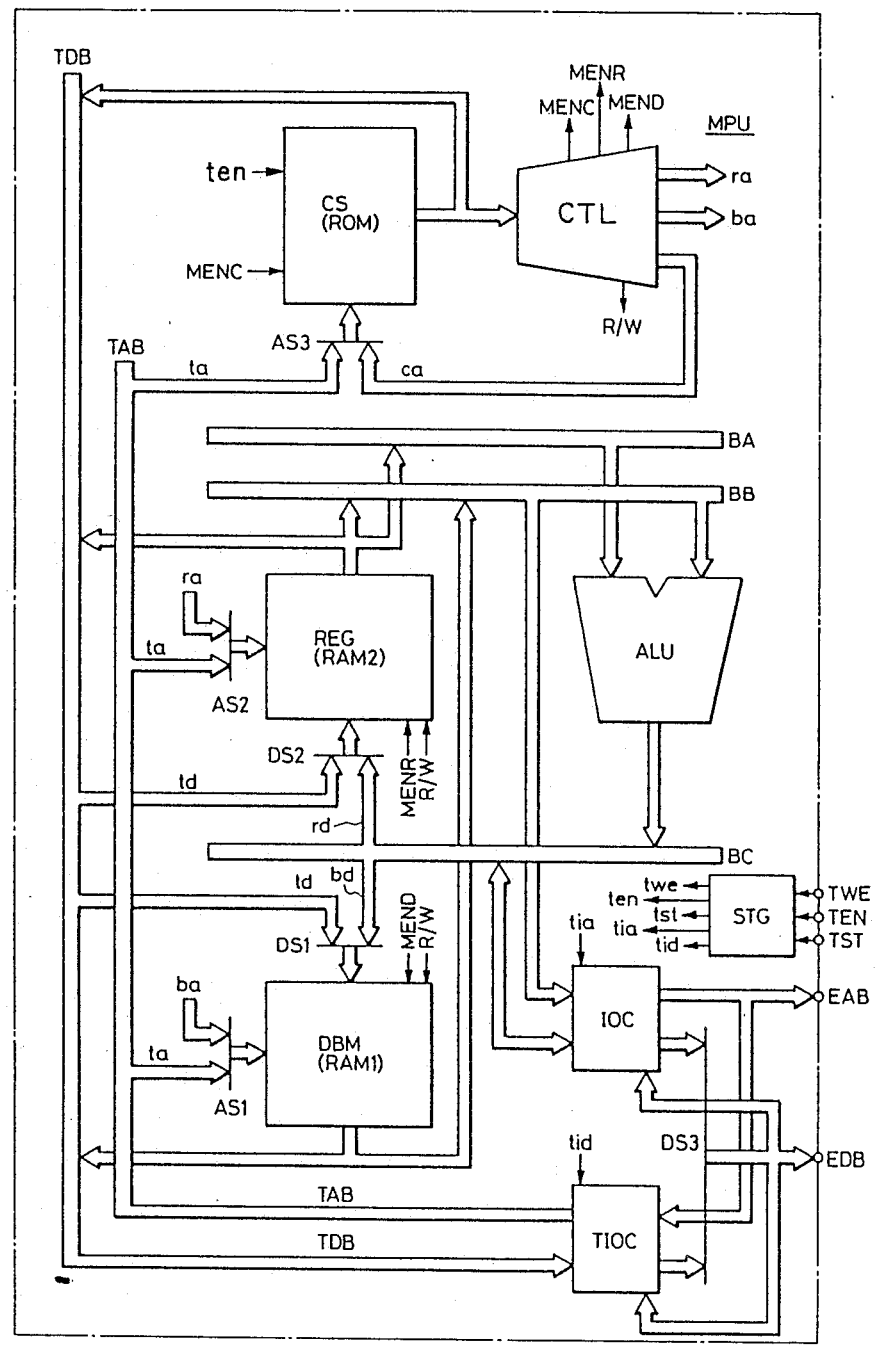
FIG. 1 is a block diagram indicating an embodiment of a microprocessor to which the present invention is applied.

FIG. 1 is a block diagram of an embodiment of a microprocessor, MPU, to which the present invention is applied. In this FIGURE, the circuit elements forming each block enclosed by a dash-and-dot line are formed, on a single semiconductor substrate like crystal silicon, by manufacturing the technique of semiconductor integrated circuits of the prior art.

A microprocessor, MPU, of this embodiment is, a processor of the microprogram system and comprises a control memory CS, (instruction ROM) which stores instructions, etc. The microprocessor MPU further comprises a register memory, REG, which is used for general purpose register and a data buffer memory, DBM, which stores temporarily calculation data and calculation results. These memories are respectively connected to corresponding internal buses when the microprocessor, MPU, is in the ordinary operation mode and are accessed individually depending on their respective functions. The instruction ROM is coupled with a control circuit, CTL, through the address bus ca. The register memory, REG, and the data buffer memory, DBM, are respectively coupled with the control circuit, CTL, through the address buses ra and ba. Thereby, in the ordinary operation mode, the memories are accessed by the address signal from the control circuit, CTL. Moreover, the memories, REG and DBM are coupled with the data bus, BC, under the ordinary operation mode and thereby data is input thereto through the bus, BC. An output of instruction ROM is supplied to the control circuit CTL in the ordinary operation mode. When the microprocessor MPU is set to the specified test mode, these memories are connected to the common test buses TAB and TDB. The test buses, TAB and TDB, are connected, to the external address bus EAB and external data bus, EDB, of the microprocessor, MPU, through the test input/output circuit TIOC. Thereby, a plurality of memories comprised in the microprocessor MPU can be individually accessed through the external address bus EAB and external data bus EDB.

In FIG. 1, the data buffer memory, DBM, of the microprocessor, MPU, comprises an address selection circuit AS1, a data selection circuit DS1 and control signal selection circuits, CS1 and CS2, not illustrated. A test control signal, tst, generated from the timing generation circuit, STG, is supplied in common as the changeover control signal to these selection circuits. This test control signal, tst, is substantially synchronized in phase with the test control signal, TST, input through the external terminal, TST. The test control signal, is usually set to a low level when the microprocessor, MPU, is set to the ordinary operation mode. Moreover, it is set to a high level when the microprocessor, MPU, is set to the specified test mode. The high level test control signal, tst, is supplied to the external terminals mentioned above from the test apparatus not illustrated.

Figure 2:
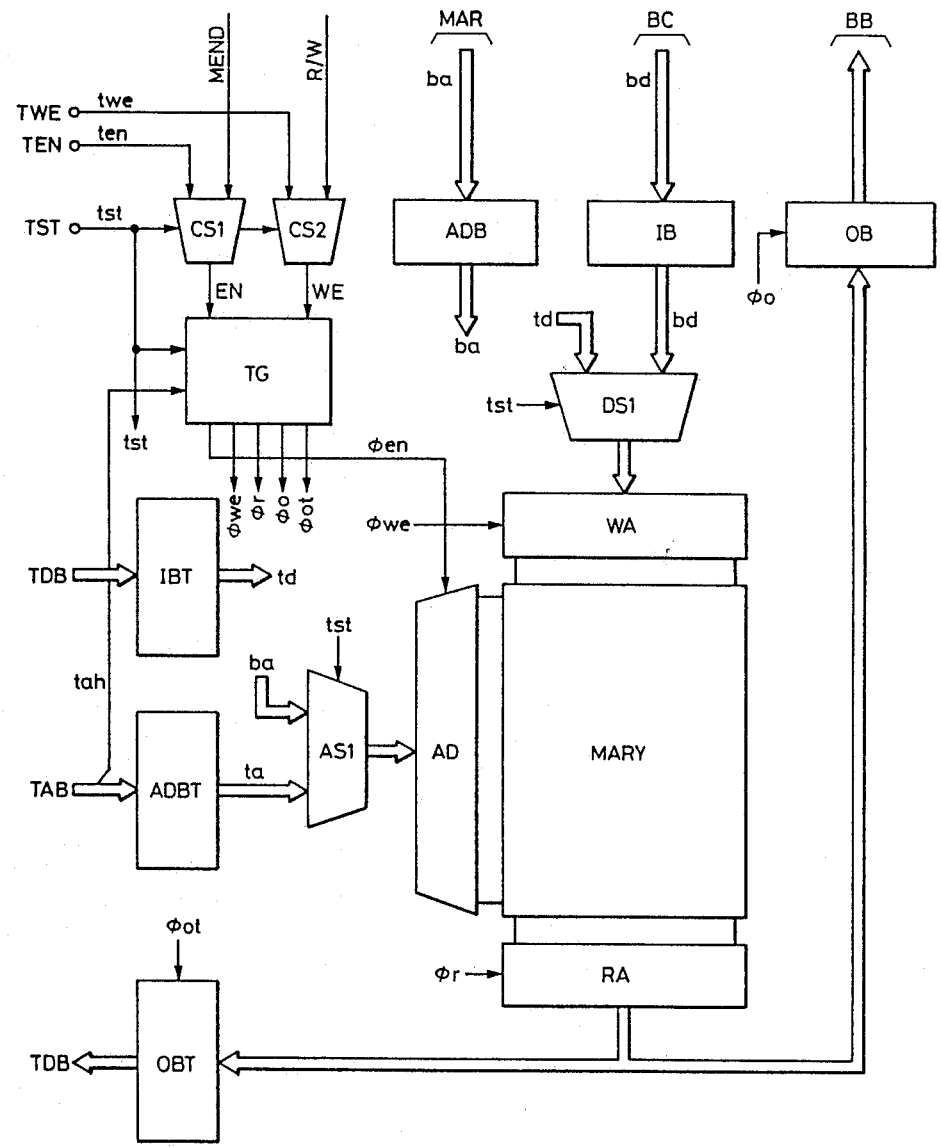
FIG. 2 is a block diagram indicating an embodiment of a data buffer memory of microprocessor of FIG. 1.

FIG. 2 is a block diagram of the data buffer memory, DBM, of the microprocessor, MPU, of FIG. 1. Prior to the explanation about the block structure of the microprocessor, MPU, practical structure and operation of the data buffer memory, DBM, are explained with reference to FIG. 2. Since the data buffer memory, DBM, the register memory, REG, and the control memory, CS, have similar structures, only the DBM will be explained.

In FIG. 2, the address signal, ba, supplied from the DBM address register, MAR, (as will be explained later with reference to FIG. 3) of the microprocessor, MPU, is input to the address buffer, ADB, of data buffer memory, DBM. An output signal of address buffer, ADB, is supplied to one input terminal of the address selection circuit, AS1. As explained previously, the test address signal, ta, supplied from the test bus, TAB, through the address buffer, ADBT, is input to the other input terminal of the address selection circuit, AS1. The test control signal, tst, is supplied as the changeover control signal to the address selection circuit, AS1. An output signal of address selection circuit, AS1, is supplied to the address decoder, AD. In FIG. 2, the address selection circuit, AS1, is provided within the memory but it may naturally be provided outside the memory, as indicated in FIGURE Therefore, the address selection circuit, AS1, is shown in both FIG. 1 and FIG. 2. This concept may also be applied to the other address selection circuits, AS2 and AS3, and data selection circuits DS1 and DS2.

The microprocessor, MPU, is set to the ordinary operation mode when the test control signal, tst, is set to the low level. When this condition exists, the address signal, ba, supplied from the control circuit, CTL, through the DBM address register, MAR, is further transmitted to the address decoder, AD, through the address buffer, ADB, and address selection circuit, AS1. The microprocessor, MPU, is set to the specified test mode when the test control signal, tst, is set to a high level. When this condition exists, the test address signal, ta, supplied from the external test apparatus through the test bus, TAB, is further transmitted to the address decoder, AD, through the address selection circuit, AS1, from the address buffer, ADBT.

Meanwhile, the input data, bd, supplied through the internal bus, BC, is input to the input buffer, IB, of the data buffer memory, DBM. An output signal of input buffer, IB, is supplied to one input terminal of data selection circuit, DS1. The test input data, td, supplied through the input buffer, IBT, from the test bus, TDB, is input to the other input terminal of the data selection, DS1. The test control signal, tst, is supplied as the changeover control signal to the data selection circuit, DS1. An output signal of data selection circuit, DS1, is supplied to the write amplifier, WA.

When the microprocessor, MPU, is set to the ordinary operation mode, the test control signal, tst, is set to a low level. In the ordinary operation mode the input data, bd, supplied through the internal bus, BC, is transmitted to the write amplifier, WA, through the input buffer, IB, and the data selection circuit, DS1. Moreover, when the microprocessor, MPU, is set to the specified test mode, the test control signal, tst, is set to a high level. When this occurs, the test input data, td, supplied through the test bus, TDB, from the external test apparatus (not illustrated) is transmitted to the write amplifier, WA, through the data selection circuit, DS1, and the input buffer, IBT.

The data buffer memory, DBM, further comprises the control signal selection circuits, CS1 and CS2. To the one input terminal of the control signal selection circuit, CS1, the start control signal, MEND, is supplied by the control circuit CTL. Moreover, to the other input terminal, the test start control signal, ten, is supplied from the timing generation circuit, STG. This test start control signal, ten, is substantially synchronized in phase with the test start control signal, TEN, supplied through the external terminal.

In the same way, to one input terminal of the control signal selection circuit, CS2, the mode control signal (read/write signal), R/W, is supplied by the control circuit, CTL. Moreover, to the other input terminal, the test mode control signal, twe, is supplied by the timing generation circuit, STG. This mode control signal, twe, is substantially synchronized in phase with the test mode control signal, TWE, supplied through the external terminal. To the control signal selection circuits, CS1 and CS2, the test control signal, tst, is supplied as the changeover signal. Output signals of control signal selection circuits, CS1 and CS2 are supplied as the start control signal, EN, and write enable signal, WE, to the timing generation circuit, TG.

When the microprocessor, MPU, is set to the ordinary operation mode, the test control signal, tst, is set to a low level and the start control signal, MEND, and mode control signal, R/W, are transmitted to the timing operation circuit, TG, as the start control signal, EN, and write enable signal, WE. In addition, when the microprocessor, MPU, is set to the specified test mode, the test control signal, tst, is set to a high level and the test start control signal, ten, and test mode control signal, twe, are transmitted to the timing generation circuit, TG, as the start control signal, EN, and write enable signal, WE.

The timing generation circuit, TG, utilizes the start control signal, EN, and the write enable signal, WE, to generate various timing signals to control the operations of respective circuits of the data buffer memory, DBM. In the test mode, the timing generation circuit, TG, has the ability to receive the test address signal, tah, and the specified number of test address signals supplied through the test bus, TAB. The timing generation circuit, TG, then decides the device code of data buffer memory, DBM. The timing generation circuit, TG, provides a means to fetch the test address signal, tah, when the test control signal, tst, is set to the high level and decide whether the address signal, tah, indicates the address previously given to the data buffer memory, DBM, or not.

The memory array, MARY, of data buffer memory, DBM, is formed, by a plurality of word lines arranged in the horizontal direction of FIG. 2, (n+1) pairs of complementary data lines arranged in the vertical direction, and a plurality of static memory cells arranged in a lattice at the cross points where these word lines and complementary data lines intersect.

The address decoder, AD, selects only one of the plurality of word lines at a time. To the address decoder, AD, the address signal, ba, or test address signal, ta, is selectively supplied, as explained previously, through the address selection circuit, AS1. Moreover, the timing signal, $\phi_{en}$, formed in accordance with the start control signal, EN, is also supplied thereto from the timing generation circuit, TG.

The address decoder, AD, is selectively set to the operating condition depending on the timing signal, $\phi_{en}$. In the operating condition, the address decoder, AD, decodes the address signal, ba, or test address signal, ta, and sets the selected word line to a high level.

The (n+1) pairs of complementary data lines forming the memory array, MARY, are respectively coupled, at one end, to the output terminals of the write amplifier, WA, and at the other end, to the input terminals of the read amplifier, RA. In this embodiment, the write amplifier, WA, provides the same number of unit circuits as there are pairs of complementary data lines in the memory array, MARY. To the input terminal of each unit circuit of the write amplifier, WA, the corresponding input data, bd, or test input data, td, are selectively supplied through the data selection circuit, DS1. The timing generation circuit, TG, supplies the unit circuits with the timing signal, $\phi_{we}$. This timing signal, $\phi_{we}$, is temporarily set to the high level in the write operation mode and while the selecting operation of word lines by the address decoder, AD, is completed.

The unit circuit of write amplifier, WA, is selectively set to the operating condition when the timing signal, $\phi_{we}$, is set to a high level. Under this operating condition, each unit circuit of the write amplifier generates complementary write signals based on the input data, bd, or test input data, td, supplied through the data selection circuit, DS1. The unit circuit then transmits each signal to its corresponding complementary data line in memory array, MARY.

The read amplifier, RA, is formed, by the (n+1) unit circuits. The input terminal of each unit circuit of read amplifier, RA, is connected to the corresponding complementary data lines of memory array, MARY. In addition, the output terminals of each unit circuit are connected to the input terminals of the corresponding bits of output buffer, OB, and test output buffer, OBT. The timing signal, $\phi_r$, is supplied, in common, to each unit circuit of read amplifier, RA, from the timing generation circuit, TG. The timing signal, $\phi_r$, is set to a high level while the data buffer memory DBM is in the read operation mode, the selecting operation of a word line by the address decoder, AD, is completed and the read signal of a selected memory cell is established.

Each unit circuit of read amplifier, RA, is selectively set to the operating condition when the timing signal, $\phi_r$, is set to a high level. Under this condition, the unit circuit of read amplifier, RA, amplifies the signal which was read from the output of complementary data line. The amplified readout signal is then supplied to the output buffer, OB, and test output buffer, OBT.

The output buffer, OB, and test output buffer, OBT, include (n+1) tristate type output circuits. The timing signals, $\phi_0$ and $\phi_{0t}$, are respectively supplied in common from the timing generation circuit, TG, to each output circuit of output buffer, OB, and test output buffer, OBT. The timing signal, $\phi_0$, is set to a high level when the data buffer memory, DBM, is functioning in the ordinary operation mode and the amplifying operation by the read amplifier, RA, is being completed. Moreover, the timing signal, $\phi_{0t}$, is set to a high level when the data buffer memory, DBM, is functioning in the specified test mode and the amplifying operation by the read amplifier, RA, is being completed.

The output buffer, OB, is selectively set to the operating condition when the timing signal, $\phi_0$, is set to a high level. Under this operating condition, the output buffer, OB, sends the signal read from the read amplifier, RA, to the internal bus, BB. When the timing signal, $\phi_0$, is set to the low level, the output of the output buffer, OB, is set to a high impedance.

The test output buffer, OBT, is selectively set to the operating condition when the timing signal, $\phi_{0t}$, is set to a high level. Under this operating condition, the test output buffer, OBT, sends the signal read from the read amplifier, RA, to the test bus, TDB. When the timing signal, $\phi_{0t}$, is set to a low level, the output of the test output buffer, OBT, is set to a high impedance.

As explained previously, when the microprocessor, MPU, is set to the ordinary operation mode, the data buffer memory, DBM, is also set to the selected condition, depending on the state of the start control signal, MEND, which is supplied from the control circuit, CTL. In this case, the operation mode of data buffer memory, DBM, is changed selectively to the write operation mode or read operation mode, depending on the state of the mode control signal, R/W, which is supplied from the control circuit, CTL. The data buffer memory, DBM, sets the word line designated by the address signal, ba, to the selected condition in order to write the input data, bd, when the operation mode is functioning in the write operation mode. Meanwhile, when the operation mode is changed to the readout operation mode, the word line designated by the address signal, ba, is set to the selected condition and the readout data is sent to the internal bus, BB.

In the test mode, the test start control signal, ten, which is supplied by the test apparatus, selects the data buffer memory, DBM. In this case, the operation mode of data buffer memory, DBM, is changed selectively to the test write operation mode or test read operation mode, depending on the state of the test mode control signal, twe, supplied from the test apparatus. The data buffer memory, DBM, sets the word line designated by the test address signal, ta, which is supplied from the test apparatus, and writes the test data, td, which is also supplied from the test apparatus, when it is set to the test write operation mode. Moreover, when it is set to the test readout operation mode, the data buffer memory, DBM, selects the word lines designated by the test address signal, ta, and sends the readout data to the test apparatus. The test apparatus, compares readout data with the reference data (for example, the data written precedingly) to conduct the test of data buffer memory, DBM.

In FIG. 1 the register memory, REG, of microprocessor, MPU, is formed by the static RAM as in the case of the data buffer memory, DBM. The register memories, REG, are used as a plurality of general purpose registers which are respectively independent for each address. The register memory, REG, comprises an address selection circuit, AS2, a data selection circuit, DS2, a pair of control signal selection circuits (CS1 and CS2 in FIG. 2), and a timing generation circuit (corresponding to TG in FIG. 2). The test control signal, tst, explained previously, is supplied in common as the changeover control signal to these selection circuits.

The address signal, ra, and test address signal, ta, supplied from the address register, MAR, in the control circuit, CTL, are supplied to the register memory, REG, through the address selection circuit, AS2. This address selection circuit, AS2, transmits, selectively, the address signal, ra, or test address signal, ta, to the address decoder (corresponding to AD in FIG. 2) in the register memory, REG. The data selection circuit, DS2, selectively transmits the input data, rd, or test input data, td, supplied through the internal bus, BC, in accordance with the test control signal, tst. In the same way, a pair of control signal selection circuits, not illustrated, transmit, in accordance with the test control signal, tst, either the start control signal, MENR, and mode control signal, R/W, supplied from the control circuit, CTL, or the control signal, TEN, which is supplied from the test apparatus, the test start control signal, ten, and test mode control signal, twe, which is formed in accordance with TWE of the timing generation circuit, not illustrated.

When the microprocessor, MPU, is set to the ordinary operation mode, the selection of the register memory, REG, is dependant on the start control signal, MENR, supplied by the control circuit, CTL. The operation mode of register memory, REG, can be changed selectively to the write operation mode or readout operation mode, depending on the state of the mode control signal, R/W. Meanwhile, when the microprocessor, MPU, is set to the specified test mode and the test address signal, tah, is addressing the register memory, REG, the selection of the register memory, REG, is dependent on the test start control signal, ten, which is supplied through the external terminal, TEN. Under these conditions, the operation mode of register memory, REG, can be changed selectively to the write operation mode or readout operation mode, depending on the state of the test mode control signal, twe.

An output signal of register memory, REG, is sent, to the internal bus, BA, when the microprocessor, MPU, is set to the ordinary operation mode. Moreover, when the microprocessor, MPU, is set to the specified test mode, the output signal is sent to the test bus, TDB.

The control memory, CS, of microprocessor MPU is formed, although not restricted particularly, by a non-volatile memory, a mask ROM or EPROM (Erasable-Programmable ROM). The control memory, CS, comprises an address selection circuit, AS3, a control signal selection circuit, not illustrated (corresponding to CS1 in FIG. 2), and a timing generation circuit. The test control signal, tst, is supplied in common as the change-over control signal to these selection circuits. The timing generation circuit (not illustrated) comprised in the control memory, CS, receives the start signal, test control signal, tst, and test address signal, tah, output from the control signal selection circuit and generates the control signal which is substantially the same as the control signals $\phi_{en}$, $\phi_0$, $\phi_{0t}$, and $\phi_r$ indicated in FIG. 2. When the test address signal, tah, is addressing the control memory, CS, and a tst signal of a high level is supplied, the timing generation circuit generates the control signal, $\phi_{en}$, after a specified period from the supply of the start signal. The timing generation circuit then generates the control signals in the sequence of $\phi_r$ and $\phi_{0t}$. On the other hand, when the tst signal is at a low level, the control signals are generated in the sequence of $\phi_{en}$, $\phi_r$, and $\phi_0$, in response to the start signal.

The address signal, ca, is supplied to one input terminal of address selection circuit, AS3, from the control circuit, CTL. The test address signal, ta, is supplied to the other input terminal through the test bus, TAB. The address selection circuit, AS3 transmits address signal, ca, to the control memory CS, when the microprocessor, MPU, is set to the ordinary operation mode. On the other hand, when the microprocessor, MPU, is set to the specified test mode, the address selection circuit, AS3, transmits the test address signal, ta, to the control memory, CS.

The specified start control signal, MENC, is supplied from the control circuit, CTL, to one input terminal of control signal selection of control memory, CS. In addition, the test start control signal, ten, is supplied to the other input terminal. The control signal selection circuit transmits the start control signal, MENC, when the microprocessor, MPU, is set to the ordinary operation mode. When the microprocessor, MPU, is set to the specified test mode, the control signal selection circuit transmits the test start control signal, ten.

Thereby, when the microprocessor, MPU, is set to the ordinary operation mode, the control memory, CS, is selected in accordance with the start control signal, MENC, which is supplied by the control circuit, CTL, and starts the readout operation mode. Thereby, the data in the address indicated by the address signal, ca, is read and is then supplied to the control circuit, CTL. On the other hand, when the microprocessor, MPU, is set to the specified test mode, the control memory, CS, is selected in accordance with the test start control signal, ten, which is supplied through the external terminal, TEN, and starts the test readout operation mode. In this case, the data in the address designated by the test address signal, ta, is transmitted to the test bus, TDB. In the case where the microprocessor, MPU, is set to the ordinary operation mode and test control signal, tst, is set to a low level, as explained earlier, the timing generation circuit in the control memory, CS, generates the control signal $\phi_{0t}$. Therefore, the test output buffer (corresponding to OBT in FIG. 2) in the control memory, CS, is set to the operating condition. Also, the output of the control memory, CS, is transmitted to the test bus TDB.

The control circuit, CTL, which will be explained later with reference to FIG. 3, decodes an instruction output from the control memory, CS, and controls operation of the circuits of the microprocessor, MPU. The control circuit, CTL, includes a program counter which provides a function to control the processing flow of programs. An output signal of the program counter in the control circuit, CTL, is supplied to the control memory, CS, as the address signal, ca.

The microprocessor, MPU, further comprises an arithmetic logic operation unit, ALU, an input/output circuit, IOC, and a test input/output circuit, TIOC.

To one input terminal of the arithmetic logic operation unit, ALU, a first operation data is supplied, for example, from the register memory, REG, through the internal bus, BA. Moreover, to the other input terminal of arithmetic logic operation unit, ALU, a second operation data is supplied, for example, from the data buffer memory, DBM, through the internal bus, BB. Moreover, the operation mode signal to select the specified operation mode to be executed from a plurality of operation modes is supplied from the control circuit, CTL, to the arithmetic logic operation, ALU.

The arithmetic logic operation unit, ALU, executes various logic operation processings for such first and second operation data. The operation mode of arithmetic logic unit, ALU, is determined by the operation mode signal (not illustrated) supplied from the control circuit, CTL. An output signal of the arithmetic logic operation unit, ALU, is sent to the internal bus, BC, through the accumulator not illustrated. The data transmitted is sent, for example, to the register memory, REG, of data memory, DBM, and written thereto.

The input/output circuit, IOC, although its internal structure is not indicated, comprises, in the present embodiment, an output address register, data register, a pair of output buffers corresponding to the external address bus, EAB, a pair of output buffers corresponding to the external data bus, EDB, and a pair of input buffers. The input terminal of output address register in the input/output circuit, IOC, is connected to the internal bus, BB. The output terminal thereof is connected to the external address bus, EAB, through the corresponding output buffer. The input terminal of the output data register of the input/output circuit, IOC, is connected to the internal bus, BC. The output terminal thereof is connected to one input terminal of the data selection circuit, DS3, through the corresponding output buffer. The input terminal of input buffer of the input/output circuit, IOC, is connected directly to the external data bus, EDB, and the output terminal thereof to the internal bus, BC.

In the similar manner, the test input/output circuit TIOC, comprises an input address register, data register, a pair of input buffers corresponding to the external address bus, EAB, a pair of input buffers corresponding to the external data bus, EDB, and a pair of output buffers. The input terminal of the input address register of test input/output circuit, TIOC, is connected to the external address bus, EAB, through the corresponding input buffer. Moreover, the output terminal thereof is connected to the test bus, TAB. The input terminal of input data register of test input/output circuit TIOC is connected to the external data bus, EDB, through the corresponding input buffer. Moreover, the output terminal thereof is connected to the test bus, TDB. The input terminal of output buffer of test input/output circuit, TIOC, is connected to the test bus, TDB, and the output terminal thereof to the other input terminal of data selection circuit, DS3.

As explained previously, the output terminal of output buffer of input/output circuit, IOC, is connected to one input terminal of data selection circuit DS3. In addition, the output terminal of output buffer of test input/output circuit, TIOC, is connected to the other input terminal. The test control signal, tst, explained above, is supplied as the changeover control signal to the data selection circuit, DS3. Moreover, the control signal, tia, generated by the timing generation circuit, STG, is supplied to the input/output circuit, IOC, and thereby the operations of such input/output circuit are controlled. In the same way, operation of the test input/output circuit, TIOC, is controlled by the control signal, tid, generated by the STG.

When the microprocessor, MPU, is set to the ordinary operation mode, a main memory and various input/output devices are connected to the external address bus, EAB, and the external data bus, EDB. When the test control signal, tst, is set to a low level, the control signal, tia, is set to a high level and the control signal, tid, is set to a low level. Thereby, the input/output circuit, IOC, is set to an operating condition and the test input/output circuit, TIOC, is set to a non-operating condition. Under this condition, the input/output circuit, IOC, sends the address signal, which was previously input to the output address register, to the external address bus, EAB. Moreover, the input/output circuit, IOC, sends the output data, which was input previously to the output data register, to the external data bus, EDB, through the data selection circuit, DS3. In addition, the input/output circuit, IOC, fetches the input data supplied through the external data bus, EDB, and transmits that data to the internal bus, BC. Thereby, the microprocessor, MPU, controls the main memory and various input/output devices.

On the other hand, when the microprocessor, MPU, is set to the specified test mode, the test apparatus is connected to external address bus, EAB, and external data bus, EDB. When the test control signal, tst, is set to a high level, the control signal, tia, is set to a low level and the control signal, tid, is set to a high level, Thereby, the test input/output circuit, TIOC, is in an operating condition and the input/output circuit, IOC, is set to a non-operating condition. In this operating condition, the test input/output circuit, TIOC, fetches the test address signal, ta, and test data, td, which are supplied by the test apparatus not illustrated, through the external address bus, EAB, and external data bus, EDB. The TIOC then holds and sends these signals to the test buses, TAB and TDB. In addition, the test input/output circuit, TIOC, sends the test readout signal output through the test bus, TDB, to the external bus, EDB, through the data selection circuit, DS3. In this case, the data buffer memory, DBM, register memory, REG, and control memory, CS, of the microprocessor, MPU, are arranged in one address space. Namely, the test address signal, tah, containing the higher bits among the test address signal, ta, indicates a device code and the devices indicated by this address signal, tah, are operated. Accordingly, the test apparatus connected externally is capable of individually making access to the data buffer memory, DBM, register memory, REG, and control memory, CS, in the microprocessor, MPU, in order to effectively test the functions and characteristics of these devices.

Figure 3:
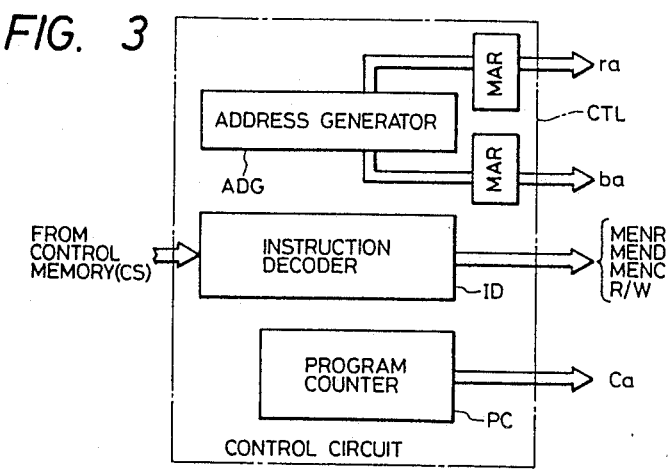
FIG. 3 is a block diagram indicating the essential portion of an embodiment of a control circuit CTL of FIG. 1.
Figure 4:
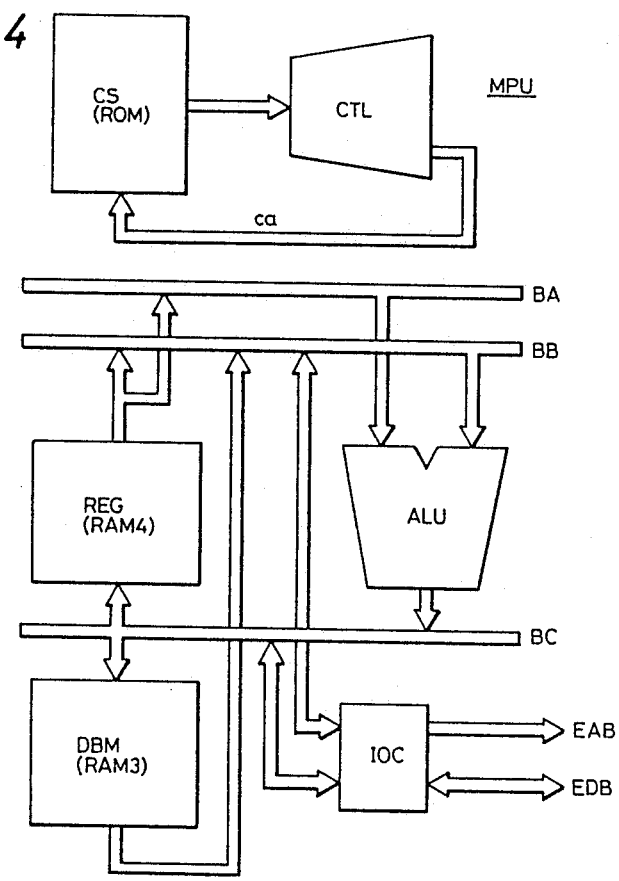
FIG. 4 is a block diagram indicating an example of a microprocessor considered prior to the present invention.

FIG. 3 is a block diagram of the essential portion of the control circuit, CTL. An instruction supplied from the control memory, CS, is decoded by an instruction decoder, ID, and a signal to control respective circuits in the microprocessor is generated. In the same FIGURE, the start signals, MENR, MEND, MENC, and mode signal, R/W are indicated. PC is the program counter that generates the address signal, ca, to indicate the address in the control memory, CS, storing the instruction to be executed next. The program counter, PC, is controlled by an output of the instruction decoder, ID, so that after the one instruction is decoded, the program counter, PC, outputs the address signal for the next instruction.

The address signals, ra and ba, are generated by the address signal generating circuit, ADG, and are respectively output through the register, MAR. This address signal generation circuit, ADG, generates the address signal, ba, which indicates the address of where the data is to be written (or read from) when writing operation data or the address of an operation result (or reading the data written previously) to be sent to the data buffer memory, DBM. In the case where the register is used for executing operations such as an arithmetic calculation, the address signal generation circuit, ADG, generates the address signal, ra, used for selection of a desired register from the register memory, REG. Since the structure of the register memory, REG, is similar to that of the data buffer memory, DBM, the address signal, ra, indicates the specific address in the memory array. Namely, the address indicated by the address signal, ra, is used as the register.

As explained previously, the microprocessor, MPU, of this embodiment comprises a data buffer memory, DBM, a register memory, REG, and a control memory, CS. These memories are connected to a corresponding internal bus depending on the functions thereof when the microprocessor, MPU, is set to the specified test mode, these memories are connected to the common test buses, TAB and TDB, and are controlled in one address space of the test apparatus. Thereby, the test apparatus connected externally to the microprocessor, MPU, is capable of individually making access to such memories in order to test functions and characteristics thereof effectively. Accordingly, the testing cost of microprocessor, MPU, can be reduced and functions and characteristics can also be evaluated accurately.

It is also possible that the test bus, TDB, is not provided and the internal bus, for example, is used also in the test mode as well as in the ordinary operation mode. In this case, in the test operation mode, it is preferable that an output of each memory is provided to the internal bus, BB, and an input to each memory is supplied from the internal bus, BC. Also, in this case, the structure of test input/output circuit, TIOC, can be simplified by transferring test data between the external bus, EDB, and internal buses, BB and BC, through the input/output circuit, IOC.

Figure 5:
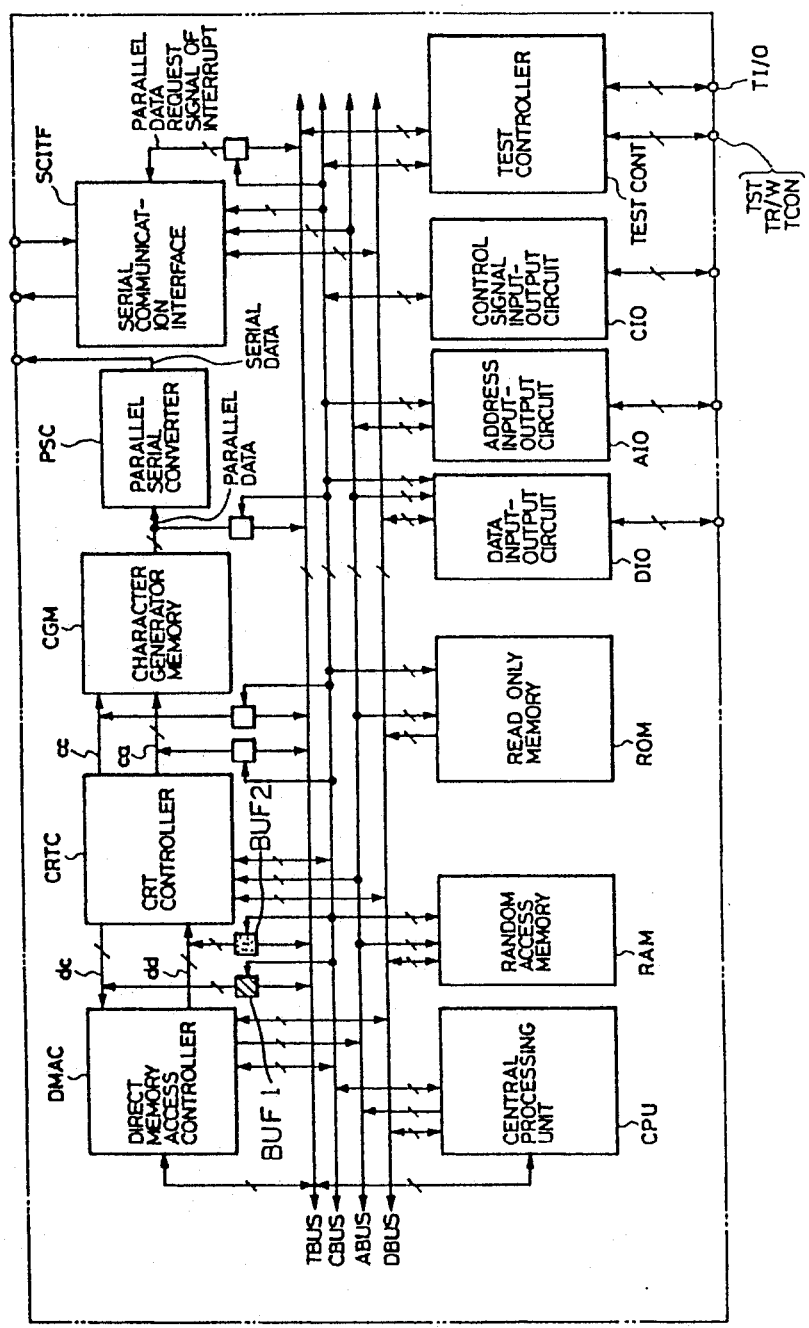
FIG. 5 is a block diagram indicating a microcomputer system formed by the function system which is an embodiment of a semiconductor integrated circuit device to which the present invention is applied.

FIG. 5 indicates another embodiment of a semiconductor integrated circuit device of the present invention. This embodiment is a block diagram of the microprocessor system, LSI, formed by the function cell system.

A microprocessor system, LSI, indicated in FIG. 5 is formed, by providing a plurality of function cells on one semiconductor substrate. The system is implemented with known semiconductor integrated circuit manufacturing technology.

The function cells of this embodiment include a central processing unit, CPU, a random access memory, RAM, a read only memory, ROM, a direct memory access controller, DMAC, a CRT controller, CRTC, a character generation memory, CGM, a parallel to serial conversion circuit, PSC, a serial communication interface, SCITF, a data input/output circuit, DIO, an address input/output circuit, AIO, a control signal input/output circuit, CIO, and a test controller, TEST-CONT.

The central processing unit, CPU, controls the system as a whole. The random access memory, RAM, programmably stores various kinds of data. The read only memory, ROM, is a memory only for reading programs. The direct random access controller, CMAC, is a peripheral controller which controls data transfer in place of the central processing unit, CPU.

The CRT controller, CRTC, provides a row buffer which stores display code data for one row being displayed on the externally connected CRT display unit not illustrated and the row to be displayed next. This CRT controller, CRTC, supplies the content of the row buffer of the current display to a character generation memory, CGM, in the display timing, reads the picture display data and supplies the data to the CRT display unit not illustrated. This data is used as the video signal that controls the picture display. The parallel to serial connection circuit, PSC, is utilized in the processing of the data. In this case, the CRT controller, CRTC, simultaneously conducts the control to fetch the display code data to be displayed next. This data, transferred from the RAM by the DMAC, is stored in another row buffer.

The serial communication interface, SCITF, is a peripheral controller which transfer information in the bit serial mode between externally connected printer or keyboard, not illustrated, and this microcomputer system, LSI.

The central processing unit, CPU, random access memory, RAM, read only memory, ROM, direct memory access controller, DMAC, CRT controller, CRTC, and serial communication interface, SCITF, are connected to the internal data bus, DBUS, the internal address bus, ABUS, and the internal control bus, CBUS, through specified terminals. Actual connections depend on the function of the microprocessor system, LSI, of this embodiment. The internal data bus, DBUS, internal address bus, ABUS, and internal control bus, CBUS, are respectively connected to the data input/output circuit, DIO, address input/output circuit, AIO, and control signal input/output circuit, CIO, resulting in an interface with external units not illustrated.

In the LSI thus formed, the signal input/output functions of the function cells included therein are not completely provided to external circuits through such data input/output circuit, DIO, address input/output circuit, AIO, and control signal input/output circuit, CIO. For instance, the control signal, dc (an interrupt request signal supplied to the direct memory access controller, DMAC, from the CRT controller, CRTC), data dd (supplied to the CRT controller, CRTC, from the direct memory access controller, DMAC), access control signal, cc (supplied to the character generation memory, CGM, from the CRT controller, CRTC), and address information, ca (which is sent or received between direct memory access controller, DMAC, and CRT controller, CRTC), are closed within the LSI in question. Moreover, from the point of view of functions of the LSI as a whole, it is not always necessary to know all signal input/output functions of the internal function cells included in the LSI.

In this embodiment, therefore, the test bus, TBUS, is provided as the signal line which inputs or outputs the signal not provided to the external circuits in the ordinary operation. In the test mode, the test bus, TBUS, is connected to the external terminals through the test controller, TESTCONT, through an external terminal for testing only. When a high level signal is supplied to the test controller, TESTCONT, through the external terminal, TST, which is used for testing only, the test controller, TESTCONT, is set to the test mode. Conversely, when the test terminal, TST, is set to a low level, the test controller, TESTCONT, sets the system, LSI, to the ordinary operation mode. When the test controller, TESTCONT, is set to the test mode, the operation of the function cell is selected. This selection is based on the control signal supplied to the test controller, TESTCONT, and the control signal input/output circuit, CIO. All signals to be input or output by the intrinsic signal input/output function of the function cell are released to an associated external test circuit through the data input/output circuit, DIO, address input/output circuit, AIO, control signal input/output circuit, CIO, and test controller, TESTCONT. Intrinsic signals not provided for the external circuit in the ordinary operation can, then, be sent to the associated external test circuit the test controller, TESTCONT, and external terminal, TI/O.. It follows then that, if there are functions which are not available to associated non-test mode circuits among the intrinsic signal input/output functions of function cells included in the LSI this embodiment, the designated function cell can be tested individually from the external circuit by setting the test mode. In addition, in the test mode, the read/write mode of function cells such as memory is changed by a signal (read/write signal) applied to the external terminal.

Figure 6:
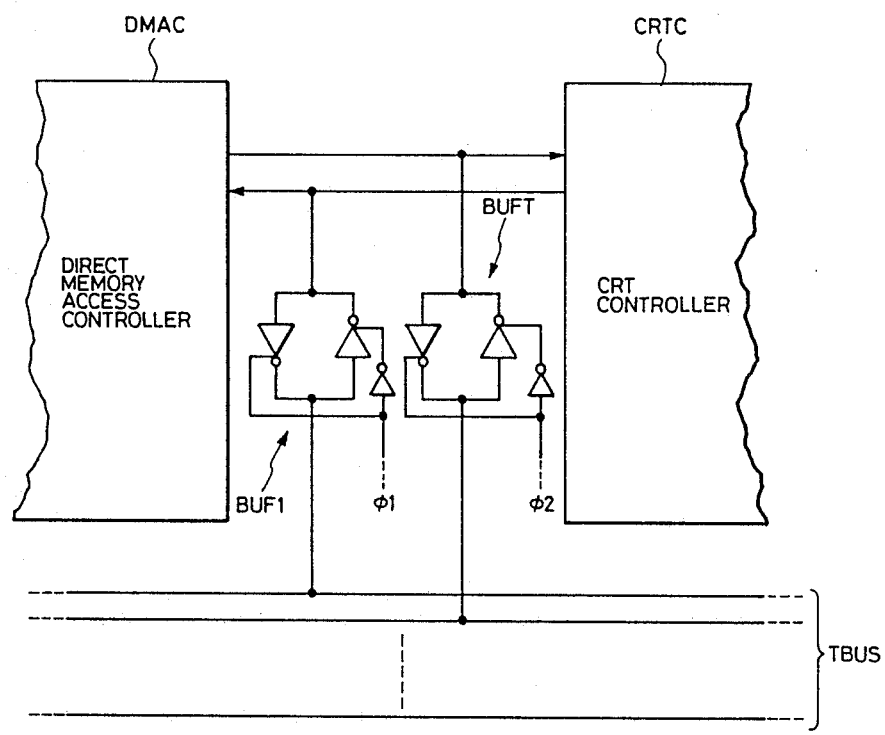
FIG. 6 is a schematic diagram indicating an example of a coupling system between the function cell and test bus; and, FIG. 7 is a block diagram of essential portion of an embodiment of DMAC, CRTC AND TEST CONT.

In FIG. 5, the bidirectional buffer circuits BUF1 and BUF2, which are controlled as shown in FIG. 6, are provided between the terminals of each function cell which have a signal that is directly sent or received between a specified function cell and itself. A good example of this is the control signal transmitted between the direct memory access controller, DMAC, the CRT controller, CRTC, and the test bus, TESTBUS. Furthermore, each of the bidirectional buffer circuits, BUF1 and BUF2, electrically isolate the test bus, TESTBUS, from the terminal of each function cell when each of the control signals, $\phi_{1a}$, $\phi_{1b}$, $\phi_{2a}$, $\phi_{2b}$ has a predetermined level. Such control signals, $\phi_{1a}$, $\phi_{1b}$, $\phi_{2a}$, $\phi_{2b}$, are, generated by the test controller, TESTCONT, in the test mode (based on the signal supplied to the external terminal TCON) and are supplied to the bidirectional buffer circuits through the control bus, CBUS. For example, when the direct memory access controller, DMAC, and CRT controller, CRTC, are connected with 10 signal lines, a total of 10 bidirectional buffer circuits are provided, corresponding to each signal line. For example, on the occasion of conduction an individual test on the direct memory access controller, DMAC, the signal to be supplied to the CRT controller, CRTC, from the direct memory access controller, DMAC, can be extracted to the external circuit though the test bus, TBUS. It follows that on the occasion of conducting an individual test on the CRT controller, CRTC, the signal to be supplied to the CRT controller, CRTC, from the direct memory access controller, DMAC, can be supplied to the CRT controller, CRTC, from the external circuit through the test bus, TBUS.

It can be understood from FIG. 6, that the test bus, TBUS, is formed by a plurality of signal lines. In order to prevent complication of drawings a single line represents this plurality of lines in FIG. 5.

The control signal directly received or sent between DMAC and CRTC is necessary for respective operation of DMAC and CRTC but is unnecessary for operations of the other function cells. In addition, the control signal is not required to be output to or input from the external circuit under ordinary operation.

Figure 7:
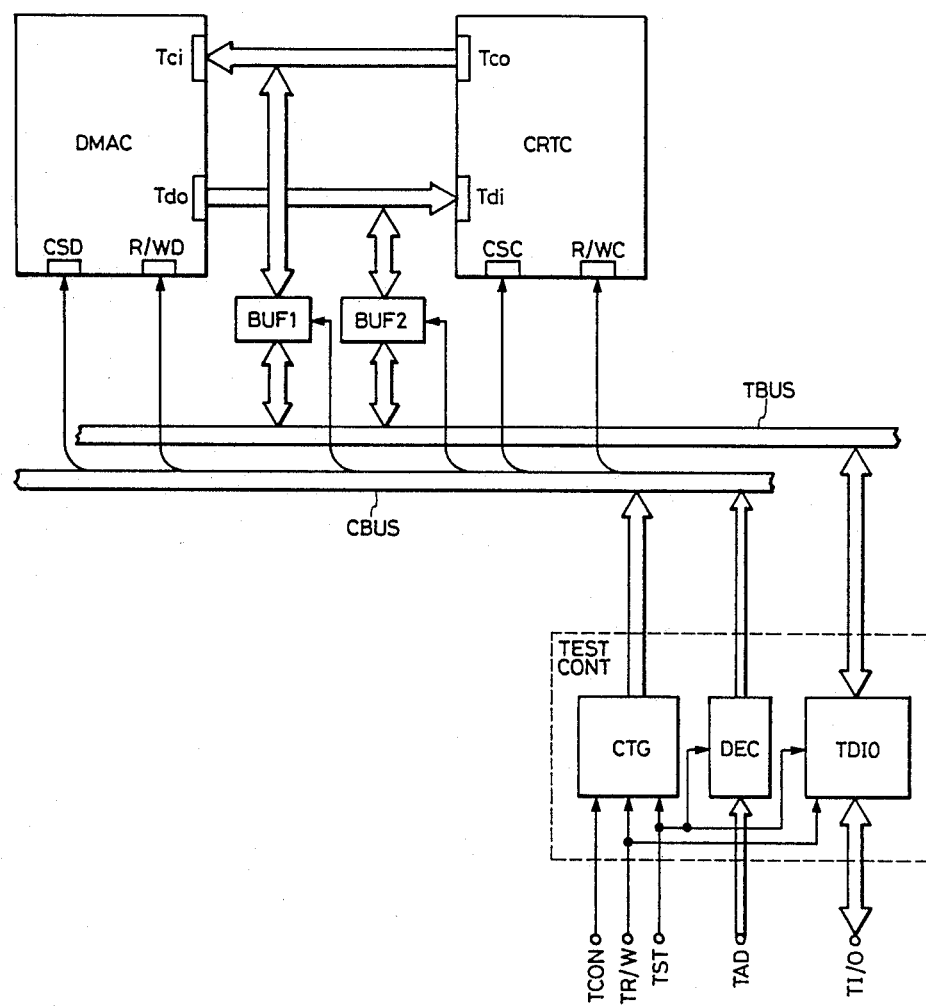

FIG. 7 indicates an example of the essential part of direct memory access controller, DMAC, CRT controller, CRTC, and test controller, TESTCONT. In this FIGURE, Tci is the input terminal of control signals for the DMA, Td0 is the data output terminal of CRTC, Tco is the output terminal of control signal CRTC, and CSD is the device selection terminal of DMAC. When a high level selection signal is supplied to this selection terminal, DMAC, is set to the operating condition. In this case, the read/write mode of the DMAC is determined by the signal supplied to the terminal R/WD. In the same way, CSC is a device selection terminal. When the high level selection signal is supplied to the selection terminal, CRTC is set to the operating condition. In this case, the read/write mode of CRTC is determined by the signal supplied to the terminal R/WC.

The essential portion of the test controller, TEST-CONT, is illustrated in FIG. 7. DEC is a decoder. When a high level signal is supplied to the test terminal, TST, indicating the test mode, the address signal supplied to the external terminal, TAD, is decoded to generate the selection signal for device selection. Thereby, the device conforming to the address signal is selectively set to the operating condition.

TDIO is a test input/output circuit. In the test mode, this circuit transmits signals between t bus, TBUS, and external input/output terminal T I/O. The test signal (supplied to the test terminal TST) which determines the mode, test or normal operation, and the test read/write signal (supplied to the terminal TR/W) are supplied to the test input/output circuit. This test input/output circuit can be formed, by the bidirectional buffer circuits, of which input/output direction is determined by the test read/write signal. CTG is the control signal generating circuit for the test which generates the signal supplied to R/WC and R/WD, depending on the test read/write signal in the test mode. Moreover, this control signal generating circuit for the test, CTG, generates the control signals, $\phi 1a$, $\phi 1b$, $\phi 2a$, $\phi 2b$, explained with reference to FIG. 6. Generation of the control signal is based on the control signal, TCON, in the test mode.

The function cell is not limited to the scaled function block explained in the embodiment indicated in FIG. 5 to FIG. 7. Moreover, the logic scale of function cell is also not limited only to the scale of the embodiment explained above. It may be changed as required, depending on the scale of system of LSI formed by the function cell. As the function cell, it is only required to generate an output signal conforming to the input signal and responding to the input signal. It is unnecessary that all signal not provided to the external circuit are output to the external circuit through the test bus under the ordinary operation. Moreover, it is also unnecessary to form the structure so that the individual test is realized from the external test circuit to all function cells. For example, individual test functions may be omitted for some memories.

In the above embodiment shown in FIG. 5 to FIG. 7, an exclusive test bus is provided. Here, it is also considered that the address bus may be used in common for input and output of test signal on a time division basis. However, in such a case a problem arises. In tests where timing is crucial, time division methods place many restrictions on performance at the test. In order to overcome the restrictions, an LSI must be completely redesigned.

As explained earlier, the following effects may be obtained by applying the present invention to a semiconductor integrated circuit device such as a microprocessor, MPU, comprising a plurality of memories.

(1) A selection circuit, which selectively transmits address signal, data and start control signal in accordance with the specified test control signal, is provided to the input/output portions of a plurality of memories comprised in the microprocessor and such plural memories are connected to the common bus in the specified test mode, thereby realizing direct access to a plurality of memories though the bus.

(2) From the item (1), functions and characteristics of a plurality of memories comprised in the microprocessor can be tested individually and effectively.

(3) From the items (1) and (2), the testing cost for microprocessor comprising a plurality of memories can be reduced and functions and characteristics can also be evaluated accurately.

(4) The signal not provided for the external circuit under the ordinary operation, among the intrinsic signal input/output functions of function cells comprised in LSI, may be output selectively to the external circuit from the test controller, TESTCONT, through the test bus, TBUS, on the basis of the control of the test controller, TESTCONT. Thereby, individual tests can be realized from the external circuit to the function cell in question even if some intrinsic signal input/output functions of function cells are not provided for the external circuit.

(5) From the effect of item (4), since the AC parameter test and function test can be tested easily and individually in unit of the function cell, the function cell in question can be tested from the external circiut of LSI by directly utilizing a test program already prepared for the individual function cell. The composite test is limited to the evaluation of total performance of the combination of function cells. Generation efficiency of test program is also improved. In addition, since each function cell can be tested individually, processing required for setting the test condition may be alleviated. Thereby, test efficiency can be improved and the reliability of test can also be improved.

(6) Since individual tests can also be realized from the external circuit for the function cells in question, the function cell can be tested even after assembling and sealing an LSI. Accordingly, realizability of tests can be far improved and observation and evaluation of the internal condition of the LSI in the fault analysis can be realized easily.

The invention proposed by the present inventors has been practically explained on the basis of an embodiment of the present invention. The present invention is not limited to the embodiment explained earlier and allows any form of modification without departure from the scope of the present invention defined in the claims thereof. For instance, one or two memories may be comprised in the microprocessor MPU in the block diagram of FIG. 1. Moreover, four or more memories can also be used. These memories may also be used for other purposes and combination of ROM and RAM is not limited only to this embodiment. Each memory may be accessed in units of a different number of bits. The test buses, TAB and TDB, may be connected to the test apparatus through other independent external terminals. Since the test start control signal, ten, test mode control signal, twn, may always be set to a high level, only the external terminal, TST, is used and the external terminals, TEN and TWE, may be omitted. In FIG. 2, the memory array, MARY, may be formed with a plurality of memory mats, and, in this case, the address decoder, AD, may be used in common for a plurality of memory mats. In addition, the complementary data lines of memory array MARY may be selectively connected to the write amplifier, WA, and read amplifier, RA, by providing a column address decoder to the circuits. Moreover, various modifications, such as the block structure of microprocessor, MPU, shown in FIG. 1, the block structure of data buffer memory, DBM, shown in FIG. 2 and a combination of an internal bus, a test bus, and a control signal may be employed.

Meanwhile, an embodiment shown in FIG. 5 to FIG. 7 and an embodiment shown in FIG. 1 to FIG. 3 may also be combined. The concept of the embodiment shown in FIG. 5 to FIG. 7 may also be introduced into the embodiment shown in FIG. 1 to FIG. 3. Also, the concept of the embodiment shown in FIG. 1 to FIG. 3 may be introduced to the embodiment shown in FIG. 5 to FIG. 7.

In the above explanation, the present invention is applied to a microprocessor but is not limited only thereto. For example, the present invention can also be applied to a single chip microcomputer and various digital control apparatus. The present invention can be widely applied to a semiconductor integrated circuit device integrating at least a plurality of function cells formed by unit function modules on a semiconductor substrate.

Briefly, a typical invention disclosed in this specification provides the following effects. Namely, a selection circuit, which selectively transmits the address signal, data and start control signal (depending on the specified test control signal), is provided to the input/output portions of a plurality of memories comprised in the microprocessor. Such a plurality of memories can be directly accessed through the test bus by connecting such memories to a common test bus in the specified test mode. Thereby, the testing cost of a microprocessor comprising a plurality of memories can be reduced and functions and characteristics thereof can be evaluated accurately.

Meanwhile, since the signal not provided to the external circuit under the ordinary operation mode can be input or output from or to the external circuit in the test mode. Individual test can be easily realized from the external circuit on the function cells in question by setting the test mode. Thereby, the function cells can be tested individually without the composite test in which the test in conducted indirectly through mutual operations of function cells. Accordingly, test efficiency for the LSI or function cell system can be improved and test reliability can also be enhanced.

What is claimed is:

1. An integrated circuit microprocessor operable in a test mode and a predetermined operation mode, the integrated circuit microprocessor comprising:
   a test mode terminal for receiving a test mode signal, the test mode signal having a first logic level representative of the test mode and a second logic level representative of a predetermined operation mode;
   a mode control circuit, operatively associated with the test mode data terminal, for generating a control signal, the control signal having a first state when the test mode signal is in the first logic level to force the integrated circuit microprocessor into the test mode and the control signal having a second state when the test mode signal is in the second logic level to force the integrated circuit microprocessor into the predetermined operation mode;
   a plurality of memories, each having an address input and a data output;
   address generating circuit means, having output terminals, for generating address signals for the address input of each of the plurality of memories when the integrated circuit microprocessor is in the predetermined operation mode, and a logic operation unit;
   a plurality of internal address buses coupled to the output terminals of the address generating circuit;
   a test address bus;
   selecting means for coupling the plurality of internal address buses to the address input of each of the plurality of memories when the control signal is in the second state and for coupling the test address bus to the address input of each of the plurality of memories when the control signal is in the first state;
   data bus means, coupled to the outputs of each of the plurality of memories and to the address generating circuit means, for transferring data from the plurality of memories;
   external address terminals for receiving an external address signal;
   external data terminals for receiving an external data signal;
   address input means for coupling the external address signal received on the external address terminals to the test address bus when the integrated circuit microprocessor is in the test mode;
   address output means for coupling the address generating circuit means to the external address terminals when the integrated circuit microprocessor is in the predetermined operation mode; and,
   data input/output means for coupling data on the data bus means to the external data terminals and for coupling data on the external data terminals to the data bus means;
   wherein the test mode, respective address spaces of the plurality of memories are arranged in one address space thereby accessing the plurality of memories as one memory from the outside of the microprocessor.

2. The microprocessor of claim 1 wherein the plurality of internal address buses are supplied only with the address signals from the address generating means.

3. An integrated microprocessor operable in a test mode and a predetermined operation mode, the integrated circuit microprocessor comprising:
   a central processing unit for controlling the integrated circuit microprocessor in accordance with a predetermined program when the integrated circuit microprocessor is in the predetermined operation mode;
   an internal bus coupled to the central processing unit;
   a test bus;
   first external terminal means for receiving test control data when the integrated circuit microprocessor is in the test mode;
   second external terminal means for receiving data into the integrated circuit microprocessor and for delivering data outside of the integrated circuit microprocessor, when the integrated circuit microprocessor is in the test mode;
   third external terminal means for receiving a test address signal when the microprocessor is in the test mode;
   first and second function cells, each of which is coupled to the internal bus, the first function cell providing a first output signal inputted into the second function cell, the second function cell providing a second output signal in response to the first output signal of the first function cell;
   a signal line, coupled between the first function cell and the second function cell, for transmitting the first output signal of the first function cell to the second function cell;
   a test control circuit, coupled to the first external terminal means and responsive to a state of the test control data on the first external terminal means, for providing a specific test signal to the internal bus;

a test decoder circuit, coupled to the third external terminal means and responsive to a state of the test control data, for generating a test selecting signal to select the first function cell of the second function cell;

a test data input/output circuit, coupled between the test bus and the second external terminal means, and responsive to a state of the test control data, for coupling the test bus to the third external terminal means; and, coupling means disposed between the signal line and the test bus and responsive to the specific test signal, for coupling the signal line with the test bus, whereby data received by the second external terminal means is inputted to the signal line and the first output signal on the signal line is outputted to the second external terminal means when the microcomputer is in the test mode.

4. The microcomputer according to claim 3 further comprising:

a read only memory, coupled to the internal bus, for storing the predetermined program therein.

5. In an integrated circuit device comprising an input/output buffer circuit, a plurality of input terminals, a plurality of output terminals, and a plurality of memory arrays connected to a common data bus and a common address bus, an improved integral test circuit comprising:

test address bus means for addressing a single address space defined by the plurality of memory arrays;

a test data bus;

a test input/output buffer circuit;

first switch means for selectively connecting the input/output buffer circuit or the test input/output buffer circuit to the plurality of input terminals and to the plurality of output terminals;

second switch means for interfacing the plurality of memory arrays with the common data bus and with the test data bus, the second switch means operable to connect the common data bus with the plurality of memory arrays when the integrated circuit device is in a normal operation mode, and operable to connect the test data bus with the plurality of memory arrays when the integrated circuit device is in a test mode; and, third switch means for interfacing the plurality of memory arrays with the common address bus and with the test address bus means, the third switch means operable to connect the common address bus with the plurality of memory arrays when the integrated circuit device is in the normal mode and operable to connect the test address bus means with the plurality of memory arrays when the integrated circuit device is in the test mode.

* * * * *

UNITED STATES PATENT AND TRADEMARK OFFICE
CERTIFICATE OF CORRECTION

PATENT NO. : 4,967,387

DATED : October 30, 1990

INVENTOR(S) : Nobuo Shibasaki, et al.

It is certified that error appears in the above-identified patent and that said Letters Patent is hereby corrected as shown below:

Claim 4, column 19, line 21, delete "microcomputer" and insert therefor --microprocessor--.

Signed and Sealed this

Third Day of March, 1992

*Attest:*

HARRY F. MANBECK, JR.

*Attesting Officer*      *Commissioner of Patents and Trademarks*